July 15, 1969 T. E. BAILEY 3,456,130
LEVEL SENSING MONOSTABLE MULTIVIBRATOR
Filed Dec. 29, 1965
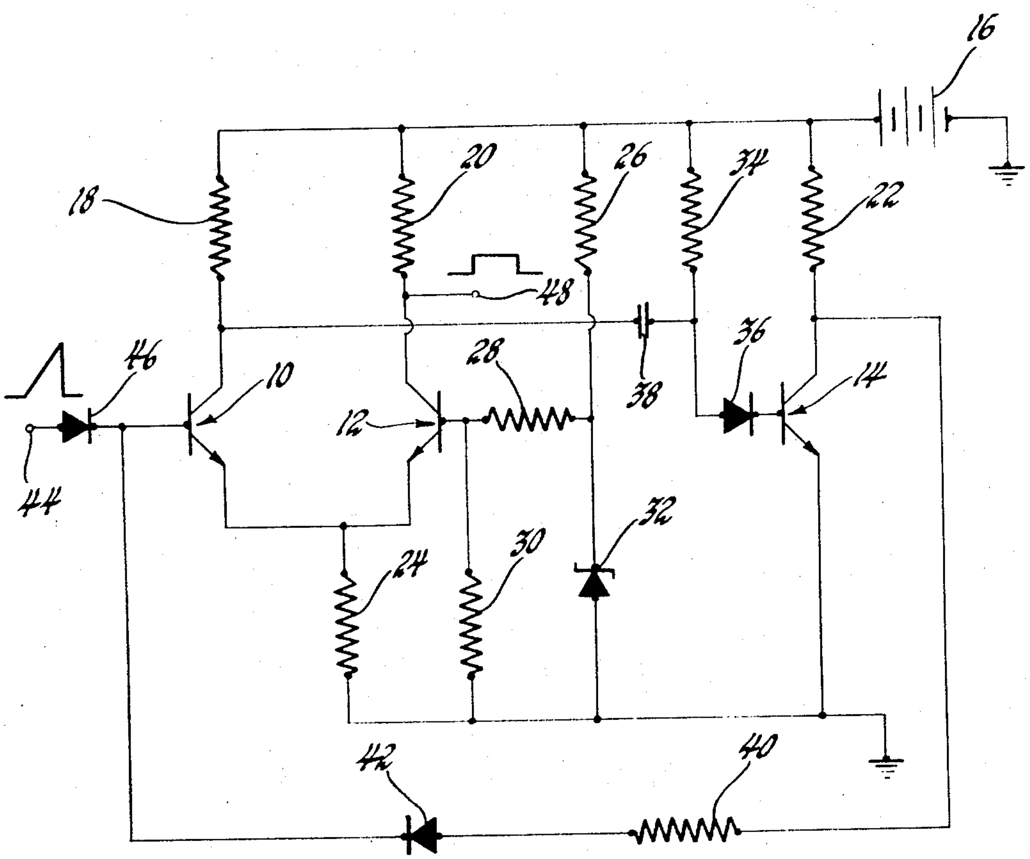
INVENTOR.
Thomas E. Bailey
BY
Albert F. Duke
ATTORNEY

United States Patent Office 3,456,130
Patented July 15, 1969

3,456,130

LEVEL SENSING MONOSTABLE MULTIVIBRATOR

Thomas E. Bailey, Milwaukee, Wis., assignor to General Motors Corporation, Detroit, Mich., a corporation of Delaware Filed Dec. 29, 1965, Ser. No. 517,276
Int. Cl. H03k 3/284
U.S. Cl. 307—273 1 Claim

ABSTRACT OF THE DISCLOSURE

A multivibrator circuit is disclosed for developing a square wave output sginal in response to a ramp input signal exceeding a predetermined discrete voltage level and includes an input transistor and an output transistor connected in a differential amplifier configuration with a third transistor cross-coupled with the first transistor to provide monostable operation.

This invention relates to multivibrator circuits and more particularly to a level sensing monostable multivibrator circuit exhibiting fast rise and fall times.

In many multivibrator applications, the leading and trailing edges of a pulse are highly critical. Particularly this is true in radar timing circuits wherein the effectiveness of the radar is largely dependent on sharp leading and trailing edges of pulses to provide a definite time from which radar calculations are made.

In accordance with the present invention, a multivibrator circuit is provided for obtaining a constant delayed output upon the occurrence of a predetermined input voltage level and which exhibits sharp leading and trailing edges. More specifically, the multivibrator circuit of the present invention includes three transistors rather than two transistors as in the conventional monostable multivibrator with the additional transistor being emitter coupled to one of the transistors such that it is driven into and out of saturation at a much faster rate than known multivibrator circuits.

A more complete understanding of the present invention may be had from the following detailed description which should be read in conjunction with the drawing in which the single figure is a preferred embodiment of the multivibrator of the present invention.

Referring now to the single figure, the level sensing monostable multivibrator comprises NPN transistors 10, 12 and 14 each having emitter, base and collector electrodes respectively. The collector electrodes of each transistor are connected to the positive terminal of a battery 16 through resistors 18, 20 and 22 respectively while the emitters of transistors 10 and 12 are connected together to ground through a common resistor 24. A voltage dividing network including resistors 26, 28 and 30 and a Zener diode 32 is connected across the source with the junction between the resistors 28 and 30 being connected to the base of transistor 12. A resistor 34 and a diode 36 are connected between the source 16 and the base of transistor 14 with a capacitor 38 being connected between the collector of transistor 10 and the junction between the resistor 34 and the diode 36. The collector electrode of the transistor 14 is connected through the resistor 40 and a diode 42 to the base electrode of the transistor 10. The base of transistor 10 is connected to an input terminal 44 through a diode 46 and the collector of transistor 12 is connected to an output terminal 48.

The operation of the multivibrator is as follows. During the quiescent or stable period, the transistor 14 is forward biased into its saturation region and the voltage at the collector of the transistor 14 which is substantially zero is fed back to the base of transistor 10 to reverse bias the emitter base junction of the transistor 10 so that the transistor 10 is cut off. The capacitor 38 is charged to nearly battery voltage through the resistor 18 and the emitter base junction of the transistor 14. The transistor 12 is forward biased in its saturation region by the reference voltage at the base of transistor 12 which reference voltage is regulated by the Zener diode 32. Current flow through the transistor 12 and the resistor 24 establishes a voltage at the emitter of transistor 10.

When an input signal appears at the terminal 44 which is depicted as a positive going ramp signal reaches the level established at the emitter of transistor 10 by the resistor 24, the transistor 10 begins to conduct. The transistor 12 is quickly brought out of saturation by the reverse biasing of its emitter base junction as a result of the increased voltage appearing at its emitter. The high positive voltage at the collector of transistor 10 begins to fall and a negative going voltage is coupled to the base of transistor 14 through the capacitor 38 decreasing the forward bias of transistor 14 and the voltage at the collector of transistor 14 increases positively. A positive going voltage is thus fed through the resistor 40, and diode 42 to the base of transistor 10 increasing its positive potential. The increased voltage at the base of transistor 10 back biases the diode 46 to isolate the circuit from the triggering input source and drives transistor 10 into saturation further lowering its collector voltage driving the transistor 14 to cut off. During discharge of the capacitor 38 through the resistor 34, the transistor 14 once again conducts and the regenerative feedback to the transistor 10 re-establishes the stable condition with transistor 10 cut off and transistor 14 in saturation. In the meantime, transistor 12 has already reached a saturated condition due to the drop in voltage at its emitter when transistor 10 begins to cut off. The output signals appearing at the collector of transistor 12 has the same pulse width as the output at the collector of transistor 14. However, the fast switching times occurring at the collector of transistor 12 provide a much sharper rise and fall time of the output pulse.

While the invention has been described with regards to a preferred embodiment thereof, modifications and variations will now occur to those skilled in the art. For a definition of the invention, reference is made to the appended claims.

I claim:

1. A level sensing monostable multivibrator for developing a square wave output signal having sharp leading and trailing edges in response to a predetermined input signal level, comprising first, second and third transistors of the same conductivity type each having emitter, base and collector electrodes, resistor means connecting the collector electrodes of said first, second and third transistors to one terminal of a source of voltage, resistor means connecting the base electrode of said third transistor to said one terminal, the emitter electrodes of said first and second transistors being coupled together through a common resistor to a reference potential, the emitter electrode of said third transistor being connected to said reference potential, a voltage dividing network including a Zener diode establishing a substantially constant voltage at the base electrode of said second transistor to normally maintain said second transistor in a saturated condition and said first transistor in a cut-off condition, circuit means coupling said first and third transistors to provide monostable operation and including a capacitor and a first unidirectional conducting device connecting the collector electrode of said first transistor to the base electrode of said third transistor and a resistor and a second unidirectional conducting device serially connecting the collector electrode of said third transistor to the base electrode of said first transistor whereby said third transistor is normally in a saturated condition in the absence of an input signal to said first transistor, circuit means including a third unidirectional conducting device connecting the base electrode of said first transistor to input signal means providing a ramp input signal, said first transistor conducting in response to said ramp input signal exceeding a discrete voltage level as determined by said voltage dividing network, means for connecting the collector electrode of said second transistor to output means.

References Cited

UNITED STATES PATENTS

| | | | |
|---|---|---|---|
| 3,068,406 | 12/1962 | Dellinger | 307—273 |
| 3,153,153 | 10/1964 | Ladd | 307—247 |
| 3,166,678 | 1/1965 | Fleshman | 307—273 |
| 3,231,761 | 1/1966 | Keller et al. | 307—273 |
| 3,239,694 | 3/1966 | Rovell | 307—247 |
| 3,292,098 | 12/1966 | Bensing | 330—30 |

JOHN S. HEYMAN, Primary Examiner

H. A. DIXON, Assistant Examiner

U.S. Cl. X.R.

307—235